(12) United States Patent
Kim et al.

(10) Patent No.: US 6,194,237 B1
(45) Date of Patent: Feb. 27, 2001

(54) METHOD FOR FORMING QUANTUM DOT IN SEMICONDUCTOR DEVICE AND A SEMICONDUCTOR DEVICE RESULTING THEREFROM

(75) Inventors: Ki Bum Kim; Tae Sik Yoon; Jang Yeon Kwon, all of Seoul (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/212,602

(22) Filed: Dec. 16, 1998

(30) Foreign Application Priority Data

Dec. 16, 1997 (KR) .................................................. 97-69281

(51) Int. Cl.$^7$ .................................................. H01L 21/00
(52) U.S. Cl. .......................... 438/22; 438/201; 438/257; 257/321
(58) Field of Search .................................. 438/36, 22, 47, 438/549, 316, 39, 38, 197, 201, 257, 265; 257/12, 13, 14, 17, 321

(56) References Cited

U.S. PATENT DOCUMENTS

| | | | |
|---|---|---|---|
| 5,532,184 | * | 7/1996 | Kato ....................................... 438/22 |
| 5,616,515 | * | 4/1997 | Okuno .................................. 438/478 |
| 5,936,258 | * | 8/1999 | Imamura et al. ....................... 257/21 |

OTHER PUBLICATIONS

O.I. Micic, et al, Appl. Phys. Lett, vol. 68, No. 22, May 27, 1996, pp. 3150–3152.
Y. Kanemitsu, et al, Appl. Phys. Lett. vol. 61, No. 18, Nov. 2, 1992, pp. 2187–2189.
H. Morisaki, et al, Appl. Phys. vol. 74, No. 4, Aug. 15, 1993, pp. 2977–2979.
D.V. Averin, et al, Single Charging Tunneling, 1992, pp. 311–332.
M.A. Kastner, Reviews of Modern Physics, vol. 64, No. 3, Jul. 1992, pp. 849–858.
R.A. Smith et al, J. Appl. Phys. vol. 81, No. 6, Mar. 15, 1997, pp. 2699–2703.
S. Tiwari , et al, Appl. Phys. vol. 68, No. 10, Mar. 4, 1996, pp. 1377–1379.
K. Yano, et al, IEEE Trans. Electron Devices, vol. 41, No. 9, 1994, pp. 1628–1638.
A. Nakajima, et al, Appl. Phys. vol. 70, No. 13, Mar. 31, 1997, pp. 1742–1744.
S. Wolf, Silicon Processing for the VLSI Era. vol. 2, chap. 8, pp. 567–574.
K.K. Likharev, IBM J. Res. Development. vol. 32 No. 1 Jan. 1988 pp. 144–158.
K. Nakazato, et al, J. Appl. Phys., vol. 75, No. 10, May 15, 1994, pp. 5123–5134.
D.J. Paul et al, Appl. Phys. Lett., vol. 63, No. 5, Aug. 2, 1993, pp. 631–632.
D. Ali, et al, Appl. Phys. Lett., vol. 64, No. 16, Apr. 18, 1994, pp. 2119–2120.
E. Leobandung, et al, Appl. Phys. Lett, vol. 67, No. 7, Aug. 14, 1995, pp. 938–940.
K. Nakazato, et al, Appl. Phys, Lett, vol. 61, No. 26, Dec. 28, 1992, pp. 3145–3147.
Y. Takahashi, et al, IEDM 1994, p. 938–940.
E. Leobandung, et al, IDEM 1995, p. 367–370.
D. Leonard, et al, Appl. Phys. Lett. vol. 63, No. 23, Dec. 6, 1993, pp. 3203–3205.

* cited by examiner

*Primary Examiner*—David Nelms
*Assistant Examiner*—Dung A Le

(57) ABSTRACT

Method for forming quantum dots using agglomeration of a conductive layer and a semiconductor device resulting therefrom are disclosed. The method includes the steps of forming a first insulating layer on a substrate, forming a conductive layer on the first insulating layer, forming a second insulating layer on the conductive layer, and annealing the conductive layer between the first, and second insulating layers to agglomerate the conductive layer.

14 Claims, 11 Drawing Sheets

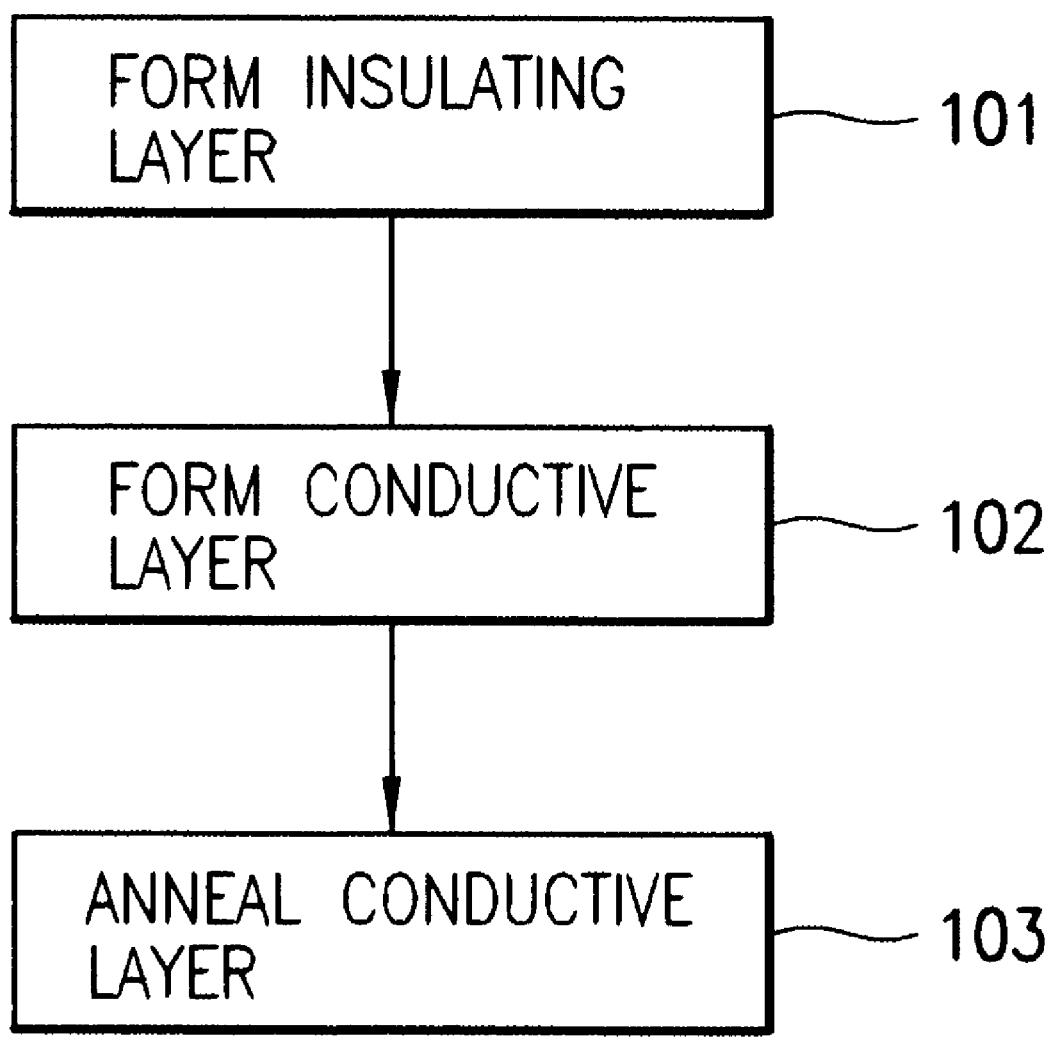

METHOD FOR FORMING QUANTUM DOT IN SEMICONDUCTOR DEVICE AND A SEMICONDUCTOR DEVICE RESULTING THEREFROM

BACKGROUND OF THE INVENTION

1. Field of the Invention

The present invention relates to a method for forming quantum dots in a semiconductor device and a semiconductor device resulting therefrom, and more particularly, to a method for forming quantum dots in a semiconductor device by utilizing agglomeration of a conductive layer or by utilizing simultaneous agglomeration and selective oxidation of the conductive layer and a semiconductor device resulting therefrom.

2. Discussion of the Related Art

The MOS structure is a basic structure of a semiconductor memory device. As limitations to this structure are detected with regard to device integration, development of a new semiconductor fabrication technology is needed for increasing a semiconductor memory device integration.

Specifically, when the semiconductor memory device has the MOS structure, the conventional method of switching based on variations of gate voltage may not be available, particularly when a semiconductor memory device has a device packing density within a 4 giga DRAM range because a distance between a source and a drain is reduced to about 0.13 µm (S. Wolf, "Silicon Processing; for the VLSI Era", V2, chap.8). In other words, integration of the MOS structure is typically limited to about 4 giga DRAM because, if the distance between the source and drain becomes closer, malfunctions of the device may occur due to tunneling between the source and the drain and through a gate oxide film, even in the absence of a gate voltage. Therefore, in order to fabricate a device of giga or tera class, a form of device other than the current MOS structure should be employed, a form of device that many research groups currently suggest is the SET(Single Electron Transistor)[see K. K. Likharev, IBM J. Res. Develop. 32(1) p144(1988)].

However, the following problems must be resolved for fabrication of the SET before it is used in place of a switching device such as a DRAM. First, in view of physical performance of the SET, a size of a quantum dot required for an SET cell should be below 10 nm or smaller to prevent errors caused by thermal vibration during operation of the cell. Therefore, at least a few nanometer quantum dot is required for allowing a room temperature operation of the SET.

Second, in addition to the above-described SET cell operation requirement, development of a process for forming quantum dots is required which allows an integration on a wafer of a size greater than 8 to 12 inches. Based on the results of current research, it can be known that the development is still at a stage at which the operation principle of the SET device is recognized. In other words, the development is still at a stage in which EBL(Electron Beam Lithography) and RIE(Reactive Ion Etching) are being used to form quantum dots. [K. Nakazato, T. J. Thornton, J. White, and H. Ahmed, Appl. Phys. Lett. 61(26), 3145 (1992)], [D. J. Paul, J. R. A. Cleaver, H. Ahmed, and T. E. Whall, Appl. Phys. Lett. 63(5), 631(1993)], [D. Ali and H. Ahmed, Appl. Phys. Lett. 64(16) 2119(1994)], [E. Leobandung, L. Guo, Y, Wang, and S. Y. Chou, Appl. Phys. Lett. 67(7), 938(1995)], [K. Nakazato, R. J. Blankie, and H. Ahmed, J. Appl. Phys. 75(10), 5123(1992)], [Y. Takahashi, M. Nagase, H. Namatus, K. Kurihara, K. Iwadate, Y. Nakajima, S. Horiguchi, K. Murase, and M. Tabe, IEDM 1994, p936], and [E. Leobandung, L. Guo, and S. Y. Chou, IEDM 1995, p365].

Such a quantum dot may be applied in a memory device of the SET as well as in a light emitting device. The application in a light emitting device is made possible based on the principle that an energy band gap increases as a dimension of a material decreases, with subsequent decrease of a wave length of an emitted light. That is, if the same material is reduced to a nano-scale, the material emits light of a wave length different from a wave length of bulk. Utilizing the dependence of wave length of emitted light on the size of the material, a size of a quantum dot may be controlled to obtain light of a desired wave length. Such research is actively underway in III–V semiconductor fields, which are typical light emitting materials. [D. Leonard, M. Krishnamurthy, C. M. Reaves, and S. P. Denbaars, and P. M. Petroff, Appl. Phys. Lett. 63(23), 3203(1993)] and [O. I. Micic, J. Sprague, Z. Lu, and A. J. Nozik, Appl. Phys. Lett. 68(22), 3150(1996)]. For instance, there are reports that silicon Si or germanium Ge, which has an indirect gap, also emits a blue light when their size is reduced. By forming a quantum dot of such a silicon or germanium, application in a light emitting device is also possible. [Y. Kanemitsu, H. Uto, and Y. Masumoto, Appl. Phys. Lett. 61(18), 2187 (1992)] and [H. Morisaki, H. Hashimoto, F. W. Ping, H. Nozawa, and H. Ono, J. Appl. Phys. 74(4), 2977(1993)].

When nano-scale quantum dots are used in the SET, the question of how the quantum dots should be distributed within a cell is basically dependent on a form of an SET structure to be used. Different forms of SET structures suggested until now may be sorted into two categories. In a first of these categories, SET structures are similar to the MOS structures in that they include a source, a drain and a gate formed together with a channel having the quantum dots which allow discrete flow of electrons. However, in this category of SET structure, the channel has an insulator and an array of multi-channel conductors(quantum dots), allowing discrete tunneling of electrons through the quantum dots, i.e., the channel has a form in which the quantum dots are embedded in the insulator[K. Nakazato, T. J. Thornton, J. White, and H. Ahmed, Appl. Phys. Lett. 61(26), 3145 (1992)], [D. J. Paul, J. R. A. Cleaver, H. Ahmed, and T. E. Whall, Appl. Phys. Lett. 63(5), 631(1993)], [D. Ali and H. Ahmed, Appl. Phys. Lett. 67(7), 938(1995)], [K. Nakazato, R. J. Blankie, and H. Ahmed, J. Appl. Phys. 75(10), 5123 (1992)], [Y. Takahashi, M. Nagase, H. Namatsu, K. Kurihara, K. Iwadate, Y. Nakajima, S. Horiguchi, K. Murase, and M. Tabe, IEDM 1994, p938], [E. Leobandung, L. Guo, and S. Y. Chou, IEDM 1995, p365], [O. I. Micic, H,. Sprague, Z. Lu, and A. J. Nozik, Appl. Phys. Lett. 68(22), 3150(1996)] and [D. V. Averin and K. K. Likaharev, in "Single Charging Tunneling", edited by H. Grabert and M. H. Devoret (Plenum, N.Y., 1992) p311]. This represents the simplest structure required for transferring electrons by discrete tunneling. Although research verifies that the Coulomb blockade effect required for operating an SET cell is also provided even though the channel is formed with a two dimensional continuous conductive line through which electrons transfer [M. A. Kastner, Rev. Mod. Phys. 64(3), 849(1992)] and [R. A. Smith and H. Ahmed, J. Appl. Phys. 81(6), 2699(1997)], the surest way of inducing the discrete tunneling of electrons is of course providing quantum dots in an insulator.

The other category of SET structures also has a structure similar to the MOS structure, with a floating point quantum dot for charging electrons in the channel thereto for reducing a current flowing through the channel [S. Tiwari, F. Rana, H. Hanafi, A. Hartstein, E. F. Crabbe, and K. Chan, Appl. Phys. Lett. 68(10), 1377(1994)], [K. Yano, T, Ishii, T. Hashimoto, T. Kobayashi, F. Murai, and K. Seki, IEEE Trans. Electron Devices 41(9), 1628(1994)], and [A. Nakajima, T. Futatsugi, K. Kosemura, T. Fukano, and N. Yokoyama, Appl. Phys. Lett. 70(13), 1742(1997)]. This form of SET structure is similar to an EPROM(Electrically Programmable Read Only Memory) which utilizes a hot carrier effect reversely. Such a reduction of current shows a quantized change resulting from electron charging when a Coulomb blockade effect appears, where electrons that are charged in the quantum dots are used to prevent successive charging of further electrons. For this, a charging energy of a cell should be lower than a thermal energy of the cell, and a voltage drop caused by the charging should be large enough to be detected when used in a memory cell, for which a size of the quantum dot should be a few nano-meter range.

In either category of SET form, various disadvantages are experienced. First, a memory function of a device is operative only at a super low temperature, because the size of the quantum dots in the device is limited due to the technological limitation of EBL and RIE. Moreover, it is apparent that the formation of the quantum dots by EBL and RIE processes currently used is generally inappropriate for obtaining adequate through-put as well as integrating on a large sized wafer. Therefore, development of a quantum dot forming process which can be integrated on a large sized wafer and which can provide an adequate through-put, other than EBL and RIE process, is absolutely required for utilizing the SET as a next generation integrated circuit.

Second, when the quantum dots are used within a light emitting device, the size of the quantum dot should be controlled to obtain light of a desired wave length. If conditions require a size of the quantum dot in a range of a few nano-meter, that has not been developed, fabrication of product will fail.

SUMMARY OF THE INVENTION

The present invention is directed to a method for forming quantum dots in a semiconductor device that substantially obviates one or more of the above and other problems due to limitations and disadvantages of the related art, and a semiconductor device resulting therefrom.

An object of the present invention is to provide a method for forming quantum dots in a semiconductor device, in which uniform quantum dots having sizes as small or smaller than a few nano-meter can be formed for an application such as an SET cell as well as an optical application such as light emitting cell.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming quantum dots in a semiconductor device, includes the steps of forming an insulating layer on a substrate, forming a conductive layer on the insulating layer, and annealing the conductive layer on the insulating layer to agglomerate the conductive layer.

In other aspect of the present invention, there is provided a method for forming quantum dots in a semiconductor device, including the steps of, forming a first insulating layer on a substrate, forming a conductive layer on the first insulating layer, forming a second insulating layer on the conductive layer, and annealing the conductive layer between the first, and second insulating layers to agglomerate the conductive layer.

It is to be understood that both the foregoing general description and the following detailed description are exemplary and explanatory and are intended to provide further explanation of the invention as claimed. Thus, it should be understood that the detailed description and specific examples, while indicating preferred embodiments of the invention, are given by way of example only. Various changes and modifications that are within the spirit and scope of the invention will become apparent to those skilled in the art from this detailed description. In fact, other objects, features and characteristics of the present invention; methods, operation, and functions of the related elements of the structure; combinations of parts; and economies of manufacture will surely become apparent from the following detailed description of the preferred embodiments and accompanying drawings, all of which form a part of this specification, wherein like reference numerals designate corresponding parts in various figures.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention. In the drawings:

FIGS. 1A–1C illustrate schematic diagrams showing an intermediate and final structure involved in a method for forming quantum dots using a free surface agglomeration and a flowchart describing that method in accordance with a first preferred embodiment of the present invention;

DETAILED DESCRIPTION OF THE PREFERRED EMBODIMENT

Figure 1A:
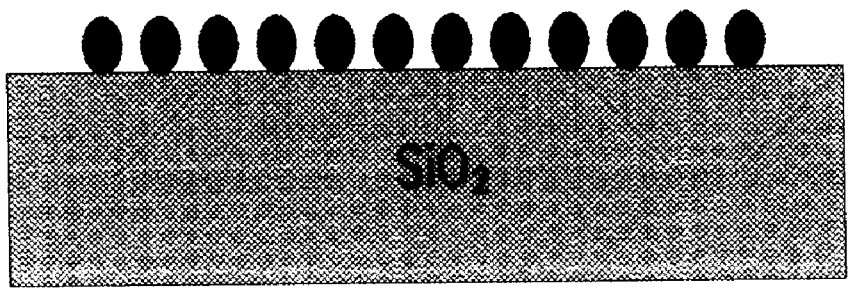
Figure 2A:
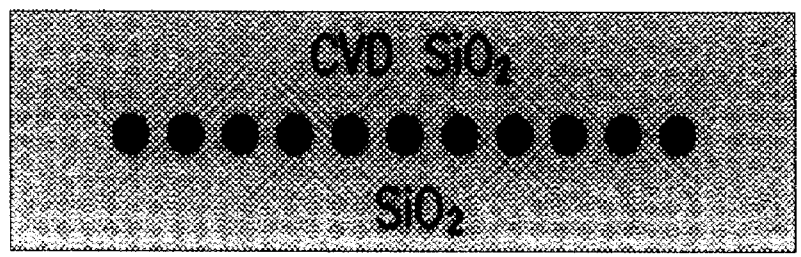
FIGS. 2A–2C illustrate schematic diagrams showing an intermediate and final structure involved in a method for forming quantum dots using an interface agglomeration and a flowchart describing that method in accordance with a second preferred embodiment of the present invention.

Reference will now be made in detail to the preferred embodiments of the present invention, examples of which are illustrated in the accompanying drawings. In the methods for forming quantum dots of the present invention, there are at least a method for forming quantum dots using an agglomeration of a conductive layer and a method for forming quantum dots using a simultaneous agglomeration and selective oxidation of a conductive layer. In the method for forming quantum dots using an agglomeration of a conductive layer, there are at least a first case in which the agglomerated conductive layer exists on a free surface and a second case in which the agglomerated conductive layer exists at an interface. FIG. 1A illustrates a schematic diagram showing the results from a method for forming quantum dots using a free surface agglomeration in accordance with a first preferred embodiment of the present invention, and FIG. 2A illustrates a schematic diagram showing the results from a method for forming quantum dots using an interface agglomeration in accordance with a second preferred embodiment of the present invention.

Figure 1B:
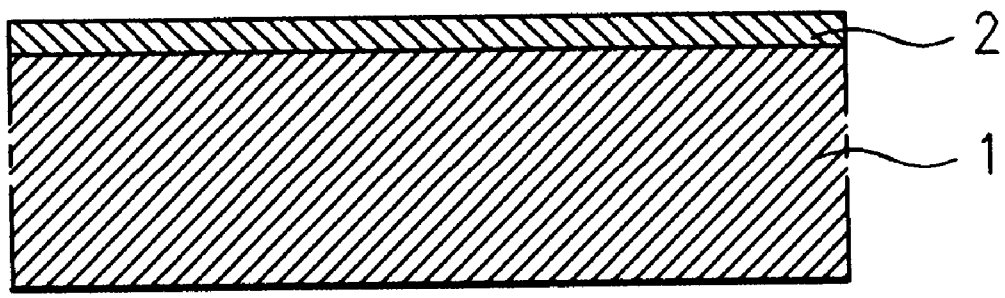
Figure 2B:
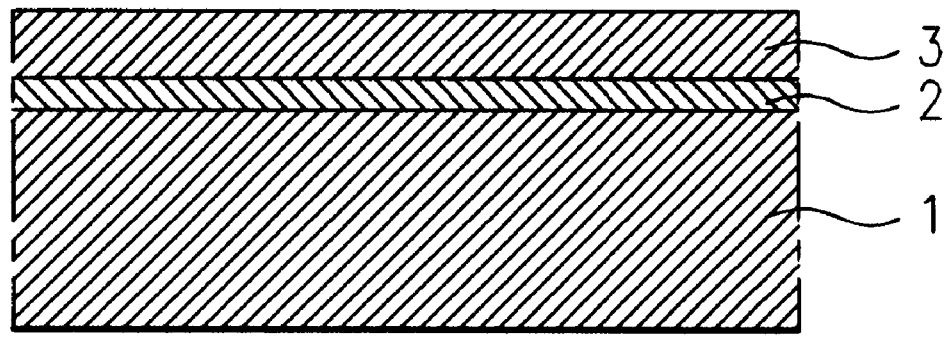
Figure 2C:
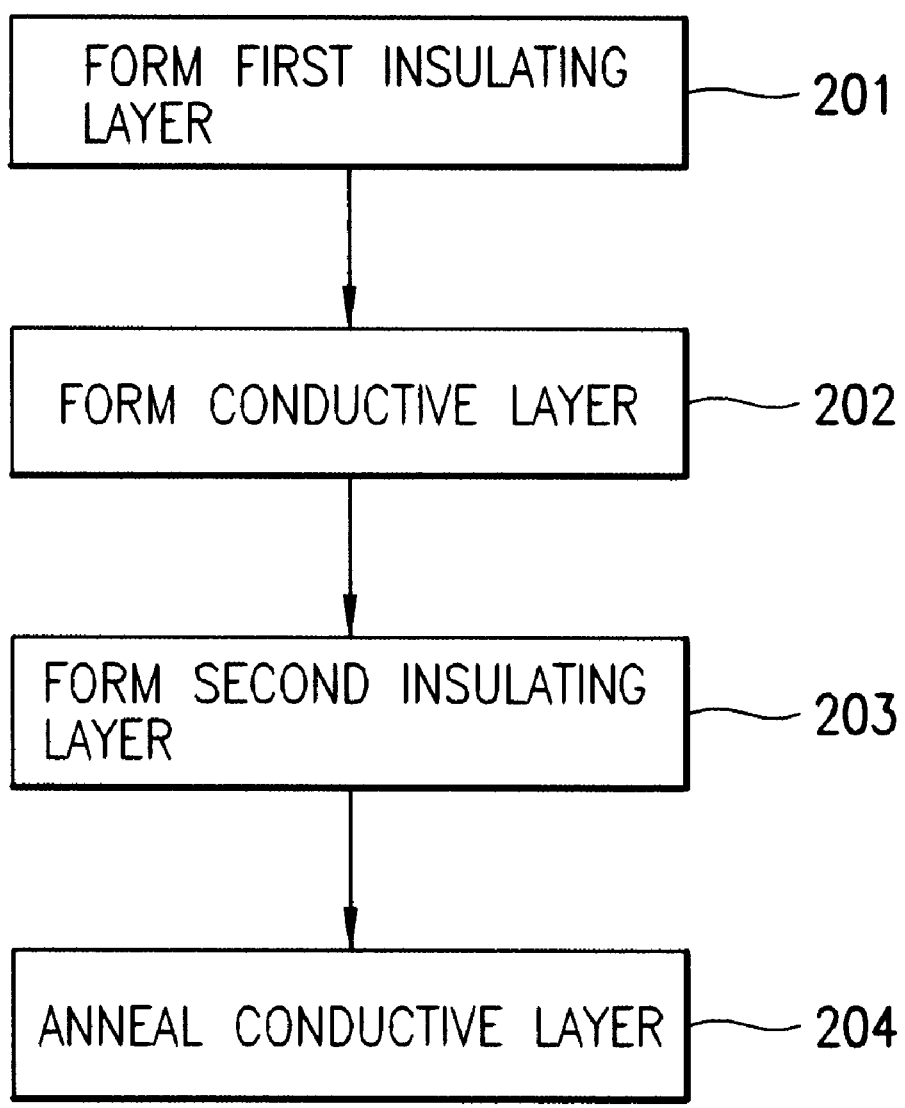

With reference to the structure shown by FIGS. 1B and 1C, the method for forming quantum dots using a free surface agglomeration starts with a step of forming an insulating layer 1 on a substrate (not shown) (step 101). The insulating layer is preferably an insulating film, such as a silicon oxide($SiO_2$) film, into which oxygen or water vapor can be diffused. A conductive layer 2 is formed on the insulating layer 1 (step 102) and subjected to an annealing process (step 103), thereby agglomerating the conductive layer 2. The conductive layer 2 may be formed of an alloy($Si_{1-x}$-$metal_x$) of Si and a material selected from Si, Ge, $Si_{1-x}Ge_x$, Al, Au, Cu, Pt, Cr, Ru and Ta, or an alloy($Ge_{1-x}$-$metal_x$) of Ge and the aforementioned material, or an alloy of the aforementioned materials, where 0<x<1. In order to prepare a test specimen, the insulating layer 1 is formed of a silicon oxide film $SiO_2$, and copper Cu is deposited thereon to a thickness around 50 Å as the conductive layer 2 and subjected to annealing at 800° C. in an nitrogen ambient, resulting in the formation of quantum dots of about 500 Å size. As such, the quantum dots are formed to a size about 10 times greater than a thickness of the deposited film due to the easy surface diffusion of the atoms. Depending on the size of the quantum dot sought, these quantum dots may or may not be used in an SET. By contrast, the interface agglomeration described below with respect to FIGS. 2A–2C is able to provide small sized quantum dots that are useful in SET devices requiring quantum dots having a very small size, because movement of the atoms in the conductive layer are restricted by the insulating layer, such as $SiO_2$ layer, formed on the conductive layer. Size, and spatial distributions of the quantum dots are expected to be comparatively uniform because the agglomerated layer is confined by the insulating layers at upper and lower sides. And, as has been explained, the SET is based on the utilization of various quantum mechanics involved in charging electrons into quantum dots by application of an external electric field, and the nano-scale transfer of electrons is dependent on the discrete energy levels. That is, the transfer of electrons is dependent on device dimensions, such as sizes of quantum dots with which a channel or capacitor of a device is formed as well as the intrinsic energy levels of the material. In order to induce the discrete tunneling of electrons only by an external electric field without being influenced by room temperature thermal vibration, the electron charging energy should therefore be greater than the thermal energy, for which entire capacitors in a capacitor array should have a value of only a few aF. Furthermore, the device dimension should be on a nano-scale level for satisfying such a condition.

In contrast to the micro-dimension, when the dimension comes down to a nano-scale level, phenomena of quantum mechanics appear (e.g., the resonant tunneling). Resonant tunneling, which is a tunneling dependent on energy levels, represents a phenomenon that appears when a material scale comes down to a nano-scale level at which discrete energy levels are involved, wherein electron tunneling occurs only when an energy level of an electrode involved in tunneling is not within a forbidden gap. Since a flow of electrons is within the range where quantum mechanics principals apply, when a device dimension comes down to a nano-scale level, electric performance of the device is dependent on material and size of the quantum dots.

The conventional explanation of SET performance relies on notable electrical performances and performances in view of quantum mechanics of quantum dot material. The explanation will now be provided hereinafter in view of the agglomeration process as the quantum dot material is actually changed.

An agglomeration involves movements of atoms that are driven by a driving force to achieve lower levels of energy in an entire system in which the atoms are located. Factors that determine such atomic movements include a magnitude of the driving force in thermodynamic point of view and a mobility of the atoms in kinetic point of view. Therefore, the size and distribution of the quantum dots differ depending on the material of the agglomerated layer, even if the agglomeration is conducted under the same conditions. Accordingly, a method for forming quantum dots when the conductive layer exists at an interface in accordance with a second preferred embodiment of the present invention is explained hereinafter with references to FIGS. 2B–2C, FIG. 2B illustrating a sectional view showing a structure used in the method for forming quantum dots of the present invention, and FIG. 2C providing a flowchart of the method used in interface agglomeration.

Referring to FIGS. 2B–2C, a first insulating layer 1 is formed on a substrate (not shown) (step 200). The first insulating layer 1 is preferably an insulating layer, for example, of a silicon oxide $SiO_2$ into which oxygen or water vapor can be diffused. A conductive layer 2 is formed on the first insulating layer 2 (step 202), and a second insulating layer 3 is formed on the second conductive layer 2 (step 203). Then an annealing process is performed (step 204). The second insulating layer 3 is generally formed of a material identical to the material of the first insulating layer 1, but may be slightly different. As a material of the conductive layer 2 for the interface agglomeration, different conductive layers may be used, for example, different metals having great interfacial energy to the insulating layer of $SiO_2$.

Metallic material and semiconductor material for the quantum dots in the SET may provide no difference in the coulomb blockade effect, but may provide a difference in tunneling probabilities. It is expected that there is a difference in electrical performances between materials of the quantum dots. As the interface agglomeration is dependent on the interfacial energy and a moving speed of atoms, it is certain that there is a difference of the interface agglomerations depending on the material of the quantum dots. Materials which have excellent interfacial stability to silicon oxide film of the first insulating layer 1 and the second insulating layer 3 and which can retard further oxidation started at an interface include an alloy($Si_{1-x}$-$metal_x$) of Si and a material selected from Si, Ge, $Si_{1-x}Ge_x$, Al, Au, Cu, Pt, Cr, Ru and Ta, or an alloy($Ge_{1-x}$-$metal_x$) of Ge and the aforementioned material, or an alloy($metal_{1-x}$-$metal_x$) of the aforementioned materials, where 0<x<1. Then, the conductive layer 2 between the first, and second insulating layers 1 and 3 are annealed, to agglomerate the conductive layer 2 into quantum dots.

An experimental result of the present invention will be explained with respect to the quantum dots formed with the first, and second insulating layers 1 and 3 of silicon oxide $SiO_2$ and the conductive layer 2 of $Si_{0.7}Ge_{0.3}$ using the interface agglomeration. As explained previously, it can be expected that the interface agglomeration is dependent on the material of the agglomerated layer. Therefore, to suit to an Si-base device fabrication, the conductive layer is formed of $Si_{0.7}Ge_{0.3}$, which is silicon added with a 30% of germanium, to improve atomic mobility, utilizing the selective oxidation effect of germanium in the annealing and altering quantum mechanic performance of the quantum dots. The experiments should be conducted while varying the germanium composition, for verifying changes both in the quantum dot formation and in electrical performance, such as resonant tunneling. An experimental result only on 30% of germanium will be explained hereinafter.

$SiO_2$(first insulating layer) is deposited on a single silicon substrate to a thickness of 470 A at 425° C. by LPCVD, and a conductive layer 2 of $Si_{0.7}Ge_{0.3}$ is deposited thereon to a thickness of 30 A at 375° C. Then, a CVD-$SiO_2$(second insulating layer) is deposited thereon to a thickness of 130 A at 375° C. In this instance, a similar experimental result can be obtained even if the $SiO_2$ is deposited to a thickness of 440~550 A at 400~550° C. by LPCVD, the conductive layer 2 of $Si_{0.7}Ge_{0.3}$ is deposited thereon to a thickness of 20~50 A at 300~450° C., and the CVD-$SiO_2$ is deposited thereon to a thickness of 100~150 A at 300~450° C.

It can be expected that the formation of the quantum dots using the $Si_{0.7}Ge_{0.3}$ layer agglomeration may differ according to condition of the annealing, because, being a process for provides energy required for settling down entire system energy to a lower state, the annealing determines an entire system energy equilibrium and moving speed of the atoms. Parameters in the annealing include temperature, ambient, and time period of the annealing, of which the significance of the annealing time period is reduced if the time period required for the agglomeration is very short. Once the driving force for the agglomeration is fixed by the annealing temperature and the quantum dots are formed by the agglomeration, there will not be any variation in the size and distribution of the quantum dots coming from inter-quantum point movements of the atoms. However, if the annealing is conducted, not in a vacuum, but in the atmospheric pressure of tube furnace with residual oxygen and water vapor, the annealing time period can be an important parameter because the influence of the residual oxygen and water vapor present in the furnace is dependent on the time period of annealing. The experimental condition determined considering the above parameters are as follows.

TABLE 1

| | |
|---|---|
| layer structure | $SiO_2$(130 A)/$Si_{0.7}Ge_{0.3}$(30 A)/$SiO_2$(470 A) |
| annealing temperature | 800° C., 900° C. |
| annealing time | 10 min. 1 hour |
| annealing ambient | $N_2$, vacuum(pressure < $10^{-6}$ torr) |

Of the above annealing conditions, the annealing in a vacuum ambient is for preventing oxidation of the $Si_{0.7}Ge_{0.3}$ layer due to oxygen and water vapor diffusion into the second insulating layer 3 ($SiO_2$) deposited thereon, and the annealing in $N_2$ ambient is for causing selective oxidation of the conductive layer($Si_{0.7}Ge_{0.3}$) using the small amount of residual oxygen and water vapor present in the tube furnace diffused into the second insulating layer ($SiO_2$), to obtain effects of size and distribution changes of the quantum dots by germanium pile-up and a germanium concentration change in the $Si_{0.7}Ge_{0.3}$ of the quantum dots.

Figure 3A:
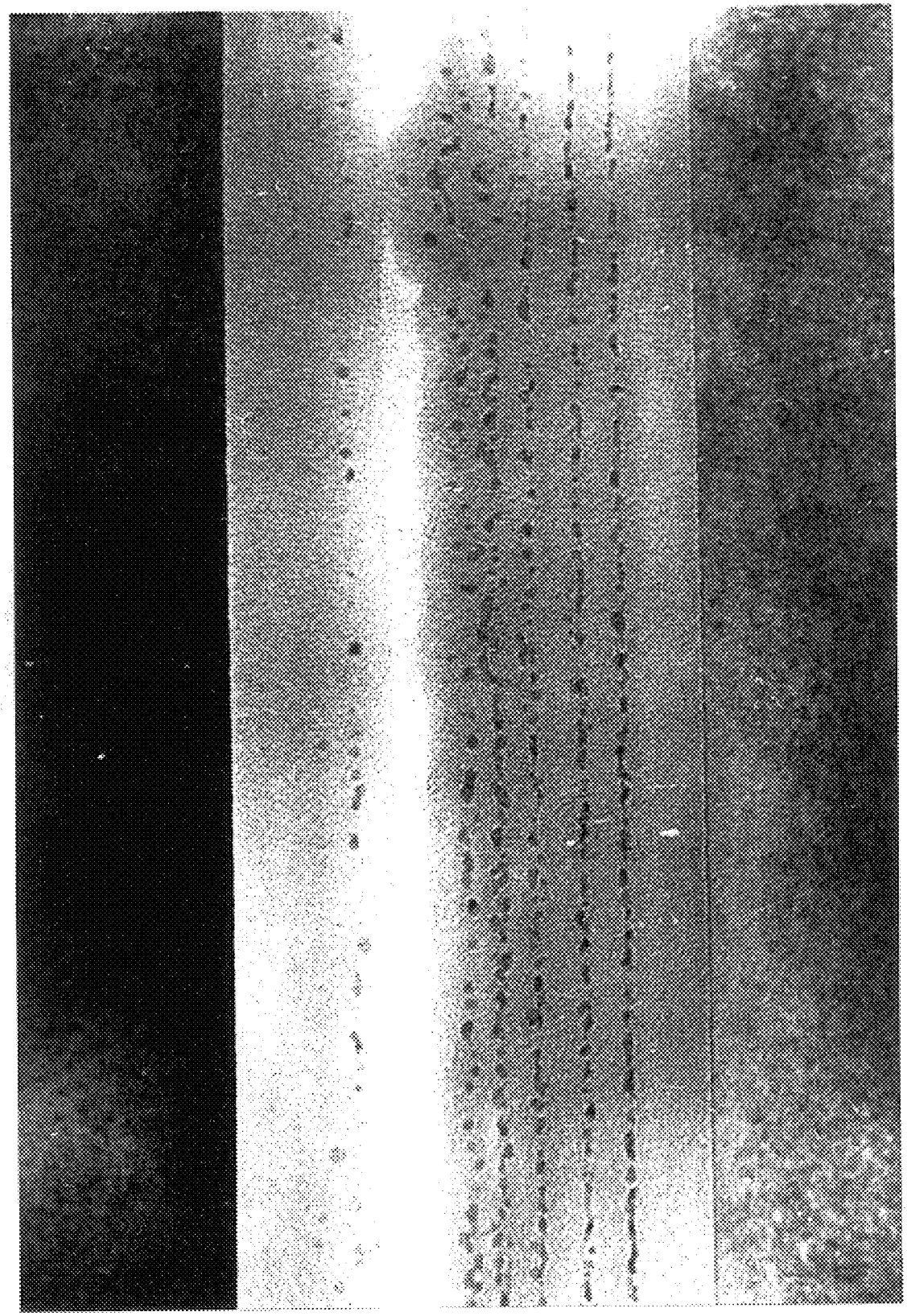
FIG. 3 illustrates cross-sectional TEM micrographs of an annealed $SiO_2/Si_{0.7}Ge_{0.3}/SiO_2$ structure in $N_2$ ambient for 10 min. at (a) 800° C., (b) 900° C.
Figure 3B:
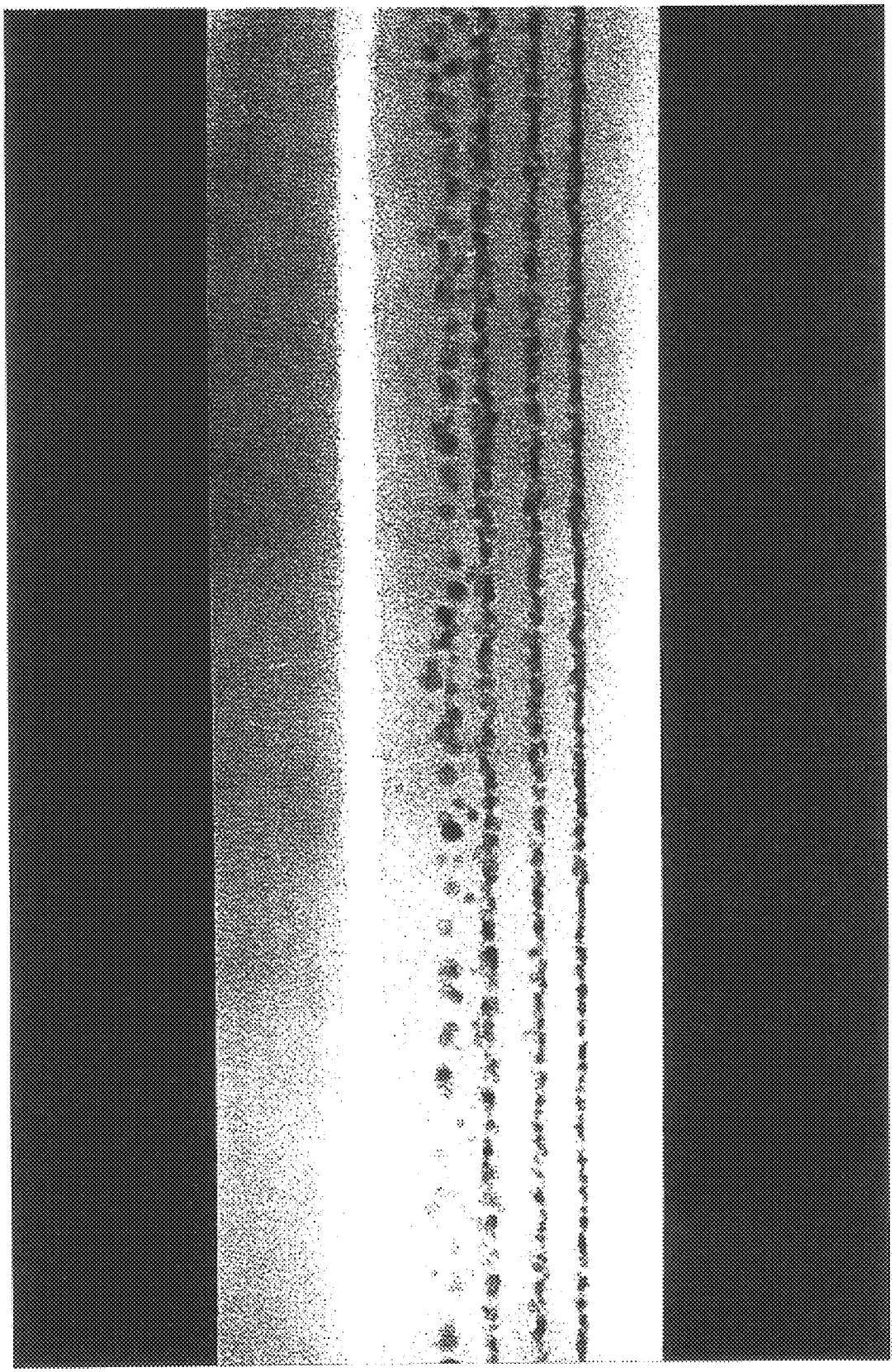
Figure 4:
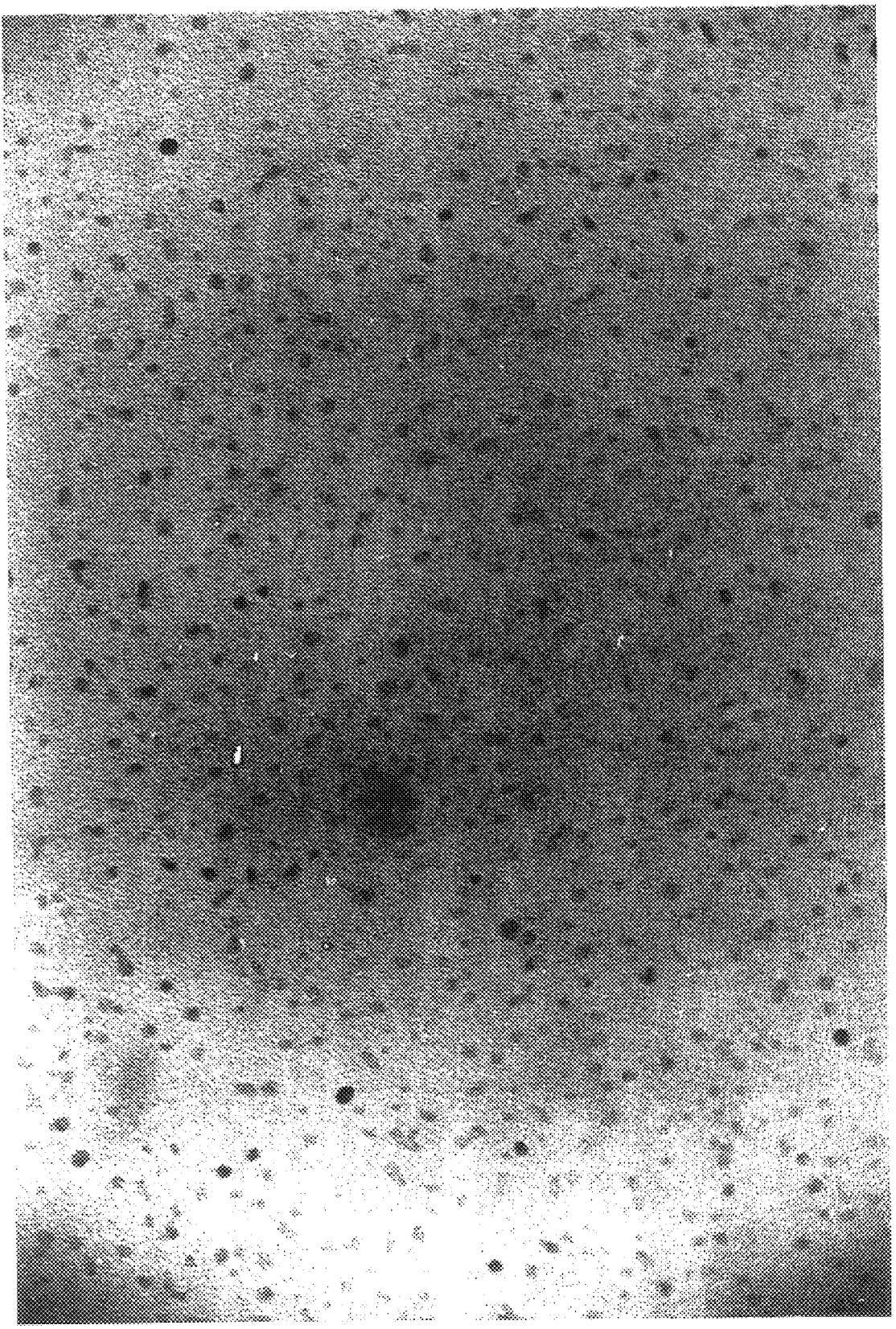
FIG. 4 illustrates a plan-view of a TEM micrograph of an annealed $SiO_2/Si_{0.7}Ge_{0.3}/SiO_2$ structure in $N_2$ ambient for 10 min. at 800° C.
Figure 5A:
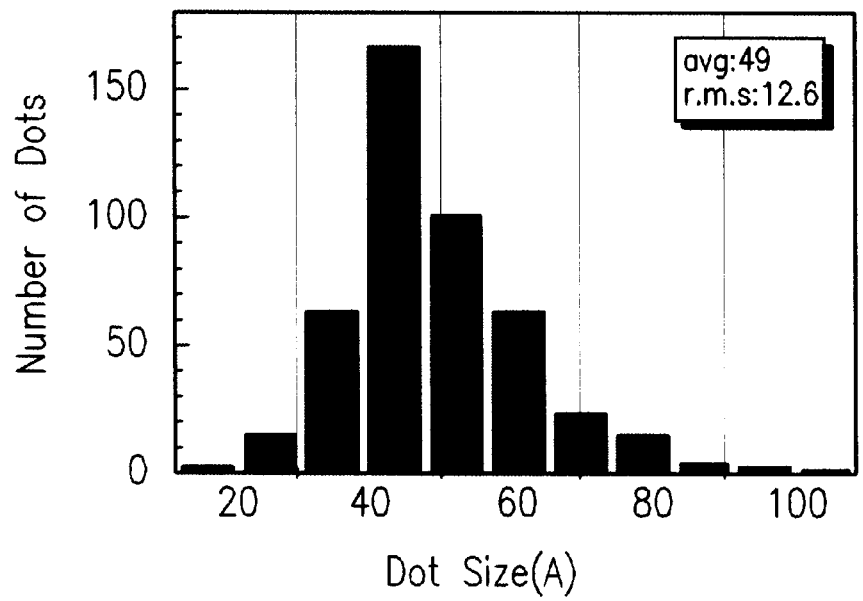
FIG. 5A illustrates a quantum dot size distribution of an $Si_{0.7}Ge_{0.3}$ sample annealed at 800° C. for 10 min. in $N_2$ ambient.
Figure 5B:
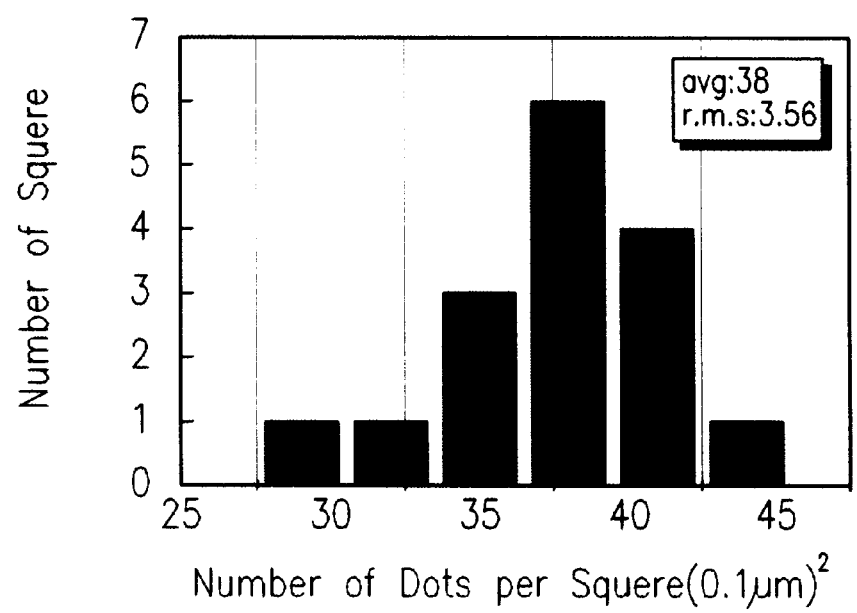
FIG. 5B illustrates a spatial quantum dot distribution of an $Si_{0.7}Ge_{0.3}$ sample annealed at 800° C. for 10 min. in $N_2$ ambient.

The result of annealing under the atmospheric pressure of tube furnace in $N_2$ ambient is as follows. FIG. 3A illustrates cross-sectional TEM micrographs of an annealed $SiO_2$/$Si_{0.7}Ge_{0.3}$/$SiO_2$ structure in $N_2$ ambient for 10 min. at (a) 800° C., (b) 900° C. It can be seen from FIG. 3A that spherical quantum dots with a diameter of about 49 A are formed. Considering size and distribution of the quantum dots formed, it can be known that volume of the entire quantum dots has been substantially reduced compared to the entire volume before the annealing, likely due to partial oxidation by the residual oxygen in the furnace. This can be proved indirectly by the fact that there are more quantum dots formed when annealing in vacuum ambient. It can be seen from FIG. 3B that the $Si_{0.7}Ge_{0.3}$ layer between the $SiO_2$ layers has been disappeared. It is considered that the oxygen and water vapor present in the furnace are diffused into inside of the layer during the annealing and oxidize the $Si_{0.7}Ge_{0.3}$ layer as the annealing has been conducted under the atmospheric pressure of the tube furnace. A difference of agglomeration with respect to annealing time period is not generally detectable due a very fast agglomeration time period. Accordingly, annealing for 1 hour and annealing for 10 minutes produce identical results. FIG. 4 illustrates a plan-view of a TEM micrograph of an annealed $SiO_2$/$Si_{0.7}Ge_{0.3}$/$SiO_2$ structure in $N_2$ ambient for 10 min. at 800° C., wherefrom it can be known that the quantum dots formed have an average diameter of 49 A with the r.m.s of 12.6 A and a comparatively uniform spatial distribution. Size and spatial distribution of the quantum dots are shown in FIGS. 5A and 5B.

Figure 6:
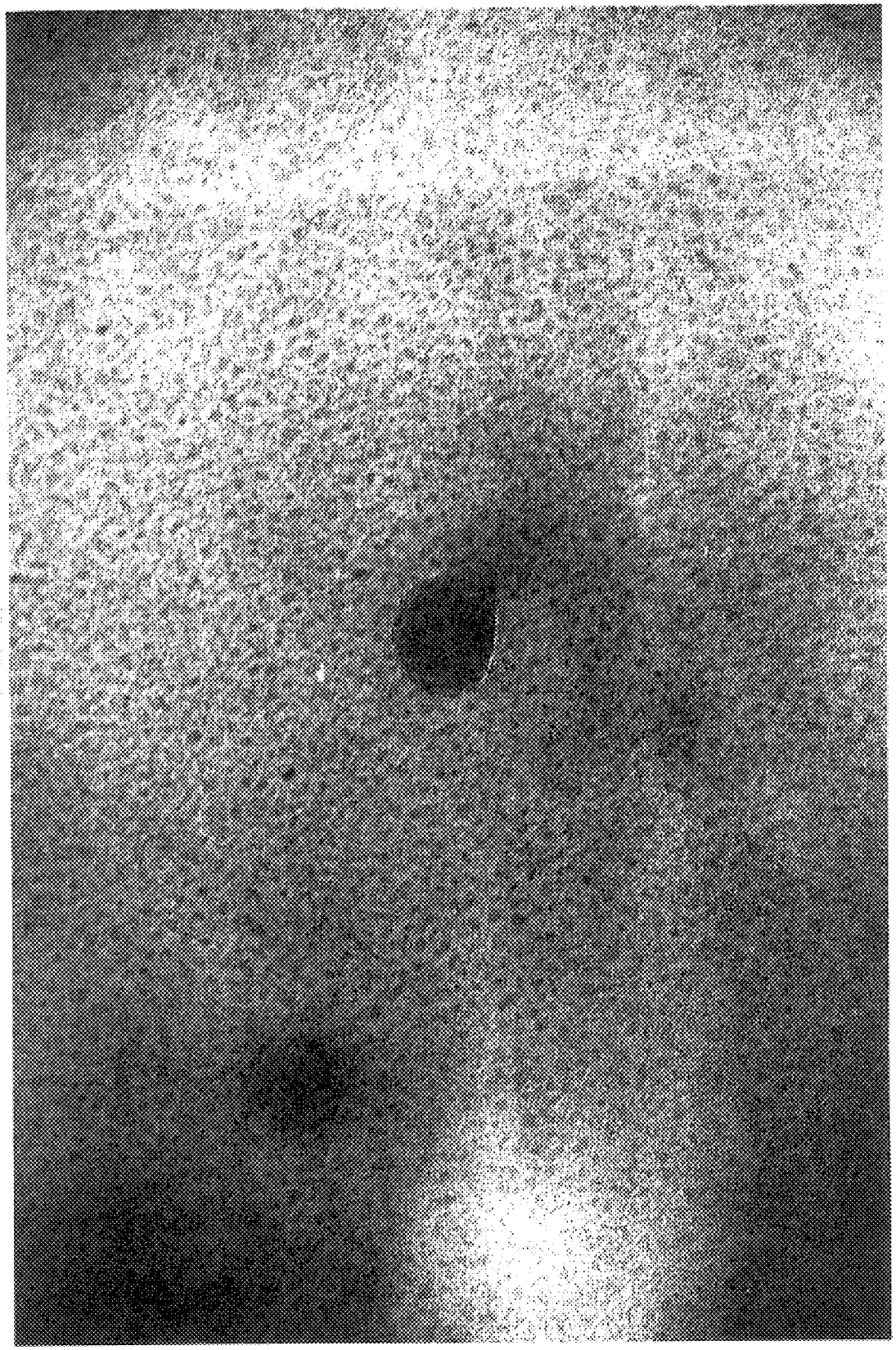
FIG. 6 illustrates a plan-view of a TEM micrograph of an annealed $SiO_2/Si_{0.7}Ge_{0.3}/SiO_2$ structure at 800° C. for 10 min. in vacuum(pressure $<10^{-6}$ torr)
Figure 7:
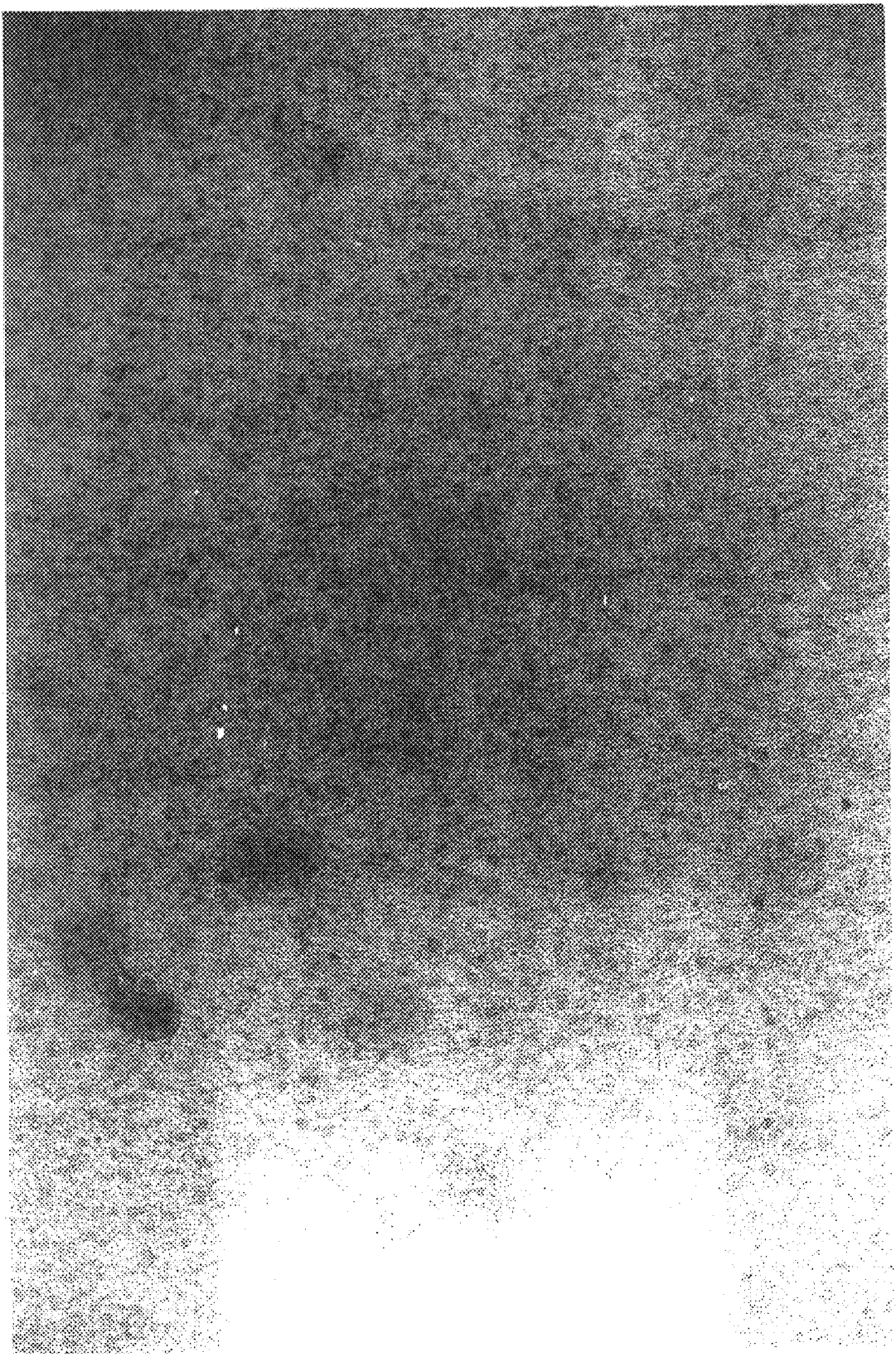
FIG. 7 illustrates a plan-view of a TEM micrograph of an annealed $SiO_2/Si_{0.7}Ge_{0.3}/SiO_2$ structure at 800° C. for 1 hour in vacuum(pressure $<10^{-6}$ torr)
Figure 8A:
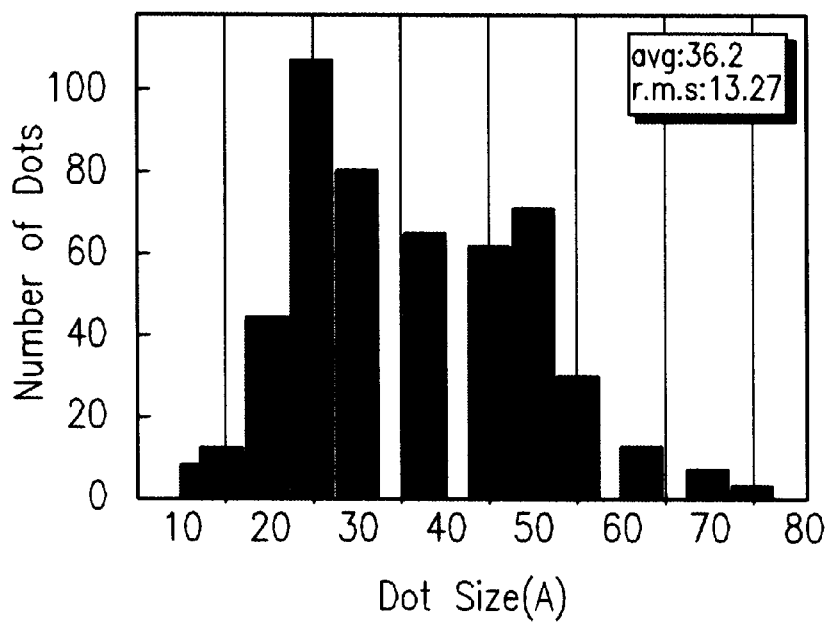
FIG. 8A illustrates a quantum dot size distribution of an $Si_{0.7}Ge_{0.3}$ sample annealed at 800° C. for 10 min. in vacuum.
Figure 8B:
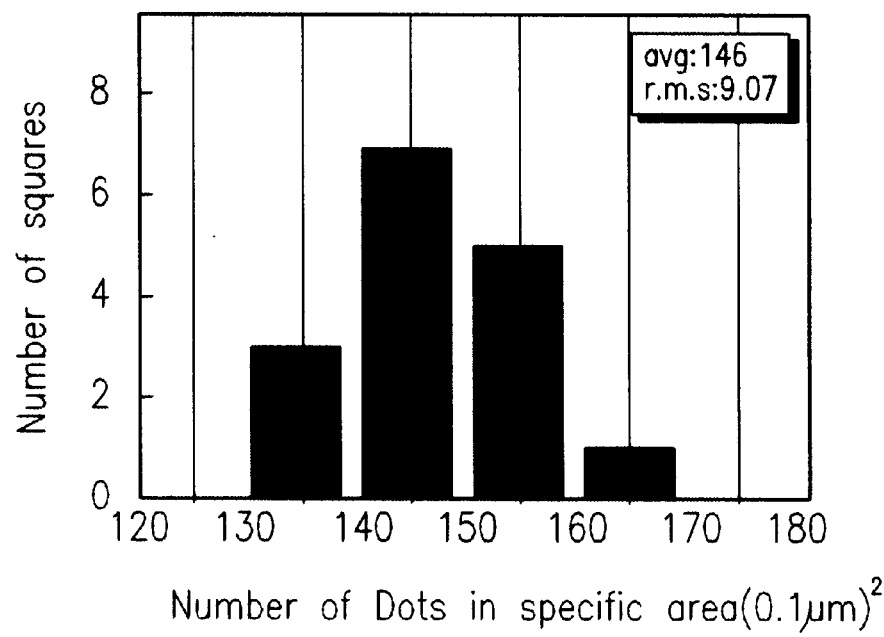
FIG. 8B illustrates a special quantum dot distribution of an $Si_{0.7}Ge_{0.3}$ sample annealed at 800° C. for 10 min. in vacuum.

An annealed $SiO_2$/$Si_{0.7}Ge_{0.3}$/$SiO_2$ structure for 10 min. at 800° C. in a vacuum that does not present any influence from ambient is compared with the above case when the structure is annealed in an $N_2$ ambient to find the quantum dots obtained by annealing in vacuum have an average diameter of 36 A with the r.m.s of 13.3 A, smaller than the case of annealing in $N_2$ ambient. FIG. 6 illustrates a plan-view of a TEM micrograph of an annealed $SiO_2$/$Si_{0.7}Ge_{0.3}$/$SiO_2$ structure at 800° C. for 10 min. in vacuum. Quantum dots annealed for 1 hour and 10 minutes respectively show no difference in average sizes. FIG. 7 illustrates a plan-view of a TEM micrograph of an annealed $SiO_2$/$Si_{0.7}Ge_{0.3}$/$SiO_2$ structure at 800° C. for 1 hour in vacuum, FIG. 8A illustrates a quantum dot size distribution of an $Si_{0.7}Ge_{0.3}$ sample annealed at 800° C. for 10 min. in vacuum, and FIG. 8B illustrates a spatial quantum dot distribution of an $Si_{0.7}Ge_{0.3}$ sample annealed at 800° C. for 10 min. in vacuum. It can be known from FIG. 8B that the average concentration of the quantum dots annealed in vacuum, being $146/(0.1 \ \mu m)^2$, is about 4 times higher than the average concentration of the quantum dots annealed in $N_2$ ambient under the atmospheric pressure in the tube furnace, being $38/(0.1 \ \mu m)^2$. This result indicates that there was selective oxidation of silicon by external oxygen or water vapor during annealing when conduction of annealing under $N_2$ ambient, resulting in consumption of the silicon while there was no consumption of silicon by external oxygen or water vapor when conduction of annealing under vacuum.

The method for forming quantum dots of the present invention as explained has the following, and other, advantages.

First, using the interface agglomeration, uniform sized $Si_{0.7}Ge_{0.3}$ quantum dots of a 3~4 nm range with uniform spatial distributions of $9.07/(0.1\ \mu m)^2$ (annealing under vacuum) and $3.56/(0.1\ \mu m)^2$ (annealing under $N_2$ ambient) in r.m.s. can be obtained.

Second, annealing under vacuum allows formation of quantum dots having a concentration higher than annealed under $N_2$ ambient in the atmospheric pressure in tube furnace[$146/(0.1\ \mu m)^2$ under vacuum vs. $38/(0.1\ \mu m)^2$ under $N_2$ ambient], with a smaller average size (36 A under vacuum vs. 49 A under $N_2$ ambient). By changing annealing ambient, size and distribution of the quantum dots can be controlled utilizing selective oxidation of silicon in $Si_{1-x}Ge_x$ (0<x<1).

Third, being a method for forming quantum dots for application in an SET or optical device such as light emitting device, the interface agglomeration allows formation of very small and uniform quantum dots compared to other existing methods, such as EBL, RIE and chemical synthesizing.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A method for forming quantum dots in a semiconductor device, comprising:

forming an insulating layer on a substrate;

forming a conductive layer on the insulating layer; and, annealing the conductive layer on the insulating layer to agglomerate the conductive layer.

2. The method claimed in claim 1, wherein the insulating layer is formed with a silicon oxide film.

3. The method claimed in claim 1, wherein the conductive layer is formed of at least one of an alloy($Si_{1-x}$-$metal_x$) of Si and a material selected from Si, Ge, $Si_{1-x}Ge_x$, Al, Au, Cu, Pt, Cr, Ru and Ta, an alloy($Ge_{1-x}$-$metal_x$) of Ge and said material, and an alloy($metal_{1-x}$-$metal_x$) of said materials, where 0<x<1.

4. The method claimed in claim 1, wherein the annealing is conducted in a vacuum.

5. The method claimed in claim 1, wherein the annealing is conducted in an $N_2$ ambient.

6. A method for forming quantum dots in a semiconductor device, comprising:

forming a first insulating layer on a substrate;

forming a conductive layer on the first insulating layer;

forming a second insulating layer on the conductive layer; and, annealing the conductive layer between the first, and second insulating layers to agglomerate the conductive layer.

7. The method claimed in claim 6, wherein each of the first and second insulating layers are formed with a silicon oxide film.

8. The method claimed in claim 6, wherein the conductive layer is formed of at least one of an alloy($Si_{1-x}$-$metal_x$) of Si and a material selected from Si, Ge, $Si_{1-x}Ge_x$, Al, Au, Cu, Pt, Cr, Ru and Ta, an alloy($Ge_{1-x}$-$metal_x$) of Ge and said material, and an alloy($metal_{1-x}$-$metal_x$) of said materials, where 0<x<1.

9. The method claimed in claim 6, wherein the annealing is conducted in a vacuum.

10. The method claimed in claim 6, wherein the annealing is conducted in an $N_2$ ambient.

11. The method claimed in claim 6, wherein the first insulating layer is a thermal oxidation film, and the second insulating layer is a chemical vapor deposition oxidation film.

12. The method claimed in claim 6, wherein both the first, and second insulating layers are formed with silicon oxide films, and the conductive layer is formed of $Si_{0.7}Ge_{0.3}$.

13. The method claimed in claim 6, wherein the first insulating layer is formed to a thickness of 440~550 A, the conductive layer is formed to a thickness of 20~50 A, and the second insulating layer is formed to a thickness of 100~150 A.

14. The method claimed in claim 6, wherein the first insulating layer is deposited with $SiO_2$ to a thickness of 440~550 A at 400~550° C. by low pressure chemical vapor deposition, the conductive layer is deposited with $Si_{0.7}Ge_{0.3}$ to a thickness of 20~50 A at 300~450° C., and the second insulating layer is deposited with chemical vapor deposition $SiO_2$ to a thickness of 100~150 A at 300~450° C.

* * * * *